United States Patent
Shinohara et al.

(10) Patent No.: US 6,421,244 B1
(45) Date of Patent: Jul. 16, 2002

(54) POWER MODULE

(75) Inventors: Toshiaki Shinohara, Tokyo; Takanobu Yoshida, Hyogo, both of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/564,547

(22) Filed: May 4, 2000

(30) Foreign Application Priority Data

Dec. 28, 1999 (JP) ............................................. 11-373430

(51) Int. Cl.⁷ ................................................. H05K 1/14
(52) U.S. Cl. ...................... 361/736; 361/783; 361/790; 361/742; 361/735; 361/784; 361/785
(58) Field of Search ................................. 361/736, 804, 361/704, 751, 770, 760–761, 783, 790, 742, 796, 735, 784–785, 792–803; 174/138 G; 439/74, 507; 257/678

(56) References Cited

U.S. PATENT DOCUMENTS

| | | | | |
|---|---|---|---|---|
| 5,291,065 A | * | 3/1994 | Arai et al. ................... | 257/723 |
| 5,444,297 A | * | 8/1995 | Oshima et al. .............. | 257/691 |
| 5,497,291 A | * | 3/1996 | Hosen ......................... | 361/804 |
| 5,751,058 A | * | 5/1998 | Matsuki ....................... | 257/692 |
| 5,942,797 A | * | 8/1999 | Terasawa ..................... | 257/723 |
| 6,060,772 A | * | 5/2000 | Sugawara et al. ........... | 257/678 |

FOREIGN PATENT DOCUMENTS

| JP | 6-045721 | 2/1994 |
|---|---|---|
| JP | 7-115287 | 5/1995 |

* cited by examiner

Primary Examiner—Jayprakash N. Gandhi
Assistant Examiner—Thanh Y. Tran
(74) Attorney, Agent, or Firm—Oblon, Spivak, McClelland, Maier & Neustadt, P.C.

(57) ABSTRACT

In a power module, an interconnection terminal (10) is inserted into a through hole (30) and a connector (16) of a control circuit substrate (12) from the side of a lower main surface of the control. circuit substrate (12). Then, the interconnection terminal (10) presses a terminal (17) to displace the terminal (17). Thus, electrical and physical connections are provided between the control circuit substrate (12) and the interconnection terminal (10) in such a manner that the interconnection terminal (10) is held between the terminal (17) and an inner peripheral side surface of the connector (16). The interconnection terminal and the control circuit substrate are fixed. to each other without using solder, whereby the power module which is easy to mount and remove is provided.

13 Claims, 7 Drawing Sheets

POWER MODULE

BACKGROUND OF THE INVENTION

1. Field of the Invention

The present invention relates to a structure of a power module and, more particularly, to a structure of a power module including an insulative substrate on which power semiconductor devices (referred to hereinafter as "power devices") are mounted and a control circuit substrate on which IC chips for controlling the power devices are mounted.

2. Description of the Background Art

FIG. 14 is a cross-sectional view of a structure of a background art power module. As illustrated in FIG. 14, the background art power module comprises an insulative substrate 104, a control circuit substrate 112, interconnection terminals, leads, or terminal members (although the term "terminals" are used hereinafter) 110, and a case 109. The insulative substrate 104 includes a ceramic plate 101 and metal plates 102, 103. A plurality of power devices 106 are mounted on the metal plate 102 with solder 105. The plurality of power devices 106 are electrically connected to each other through aluminum wires 111. The metal plate 103 is in contact with a base plate 108, with solder 107 therebetween.

A plurality of semiconductor devices 113 for controlling the power devices 106 are mounted on the control circuit substrate 112. An external connection terminal 137 electrically connected to the semiconductor devices 113 are soldered to the control circuit substrate 112.

Each of the interconnection terminals 110 has a first end electrically connected to the metal plate 102 or the power devices 106 through the aluminum wires 111, and a second end connected to the control circuit substrate 112.

The insulative substrate 104, the control circuit substrate 112 and the interconnection terminals 110 are disposed in the case 109. A lower interior space of the case 109 below the control circuit substrate 112 is filled with silicone gel 114. A cover 115 is mounted on top of the case 109. Main electrodes 135 are provided on an upper surface of the case 109 and electrically connected to the power devices 106 through terminals 136 and aluminum wires.

FIG. 15 is an enlarged cross-sectional view of a connection between the second end of one of the interconnection terminals 110 and the control circuit substrate 112. The control circuit substrate 112 has a through hole 118 around which is provided a terminal 116 electrically connected to the semiconductor devices 113. The second end of the interconnection terminal 110 is inserted into the through hole 118 and mounted therein by solder 117 applied around the through hole 118. This provides physical and electrical connections between the second end of the interconnection terminal 110 and the control circuit substrate 112.

However, such a background art power module in which the second end of the interconnection terminal 110 and the control circuit substrate 112 are joined to each other by the solder 117 requires a large number of assembling steps, resulting in increased costs. Additionally, the background art power module is uneconomical since, if a failure occurs in only one of the control circuit substrate 112 and the insulative substrate 104, both of the substrates 112 and 104 must be discarded.

SUMMARY OF THE INVENTION

According to a first aspect of the present invention, a power module comprises: a first substrate including a power device; a second substrate opposed to the first substrate and including a semiconductor device for controlling the power device; an interconnection terminal having a first end electrically connected to the first substrate, and a second end electrically connected to the second substrate; and a case having an interior space in which the first substrate, the second substrate and the interconnection terminal are disposed, wherein the second substrate further includes a connector electrically connected to the semiconductor device, and wherein the second end of the interconnection terminal is removably connected to the connector.

Preferably, according to a second aspect of the present invention, in the power module of the first aspect, the connector is disposed near an outer periphery of the second substrate.

Preferably, according to a third aspect of the present invention, in the power module of the first or second aspect, the connector is formed on a main surface of the second substrate which is on the same side as is the semiconductor device.

Preferably, according to a fourth aspect of the present invention, in the power module of any one of the first to third aspects, the connector is formed on a main surface of the second substrate which is opposed to the first substrate.

According to a fifth aspect of the present invention, a power module comprises: a first substrate including a power device; a second substrate opposed to the first substrate and including a semiconductor device for controlling the power device; an interconnection terminal having a first end electrically connected to the first substrate, and a second end electrically connected to the second substrate; and a case having an interior space in which the first substrate, the second substrate and the interconnection terminal are disposed, wherein the second end of the interconnection terminal has elasticity, and wherein the second substrate further includes a conductor pattern formed on a main surface of the second substrate which is opposed to the first substrate, the conductor pattern being electrically connected to the semiconductor device and contacting the second end of the interconnection terminal. The power module further comprises fastening means for removably fixing the case and the second substrate to each other, with the second end of the interconnection terminal displaced upon being pressed by the conductor pattern.

Preferably, according to a sixth aspect of the present invention, in the power module of the fifth aspect, the case includes a receiving surface for placing the second substrate thereon, and the fastening means includes: a first threaded hole formed in the receiving surface; a second threaded hole formed in the second substrate in a position corresponding to the first threaded hole; and a screw configured to be screwed into the first and second threaded holes.

According to a seventh aspect of the present invention, a power module comprises: a first substrate including a power device; a second substrate opposed to the first substrate and including a semiconductor device for controlling the power device; an interconnection terminal having a first end electrically connected to the first substrate, and a second end electrically connected to the second substrate; and a case having an interior space in which the first substrate, the second substrate and the interconnection terminal are disposed, wherein the second substrate further includes a through hole electrically connected to the semiconductor device, and wherein the second end of the interconnection terminal has elasticity in a widthwise direction thereof, and is removably fitted in the through hole.

Preferably, according to an eighth aspect of the present invention, in the power module of any one of the first to fourth and seventh aspects, the case includes a positioning structure for defining a mounting position of the second substrate in the case.

Preferably, according to a ninth aspect of the present invention, in the power module of any one of the first to eighth aspects, at least a connection between the second substrate and the interconnection terminal is sealed with resin.

In accordance with the first aspect of the present invention, the power module is provided in which the second substrate is easy to mount and remove since the second end of the interconnection terminal is removably connected to the connector.

In accordance with the second aspect of the present invention, the second substrate is easily mounted to the second end of the interconnection terminal. Additionally, the amount of flexure of the second substrate is reduced, with the second substrate mounted to the second end of the interconnection terminal. Consequently, an inexpensive material may be used to construct the second substrate, accomplishing reduction in manufacturing costs.

In accordance with the third aspect of the present invention, the power module is reduced in thickness, as compared with a power module including a connector and a second substrate which are formed on different main surfaces.

In accordance with the fourth aspect of the present invention, stresses acting to separate the connector and the second substrate from each other are not exerted, with the second end of the interconnection terminal connected to the connector. Therefore, the connector is prevented from being removed from the second substrate.

In accordance with the fifth aspect of the present invention, the conductor pattern is formed on the main surface of the second substrate which is opposed to the first substrate. Therefore, the power module is reduced in thickness, as compared with a power module including a connector.

In accordance with the sixth aspect of the present invention, the power module is provided in which the second substrate is easy to mount and remove since the case and the second substrate are joined to each other by the screw screwed into the first and second threaded holes.

In accordance with the seventh aspect of the present invention, the power module which is easy to mount and remove is provided since the interconnection terminal and the second substrate are fixed to each other without using solder.

In accordance with the eighth aspect of the present invention, the accuracy of a mounting position of the second substrate in the case is increased.

In accordance with the ninth aspect of the present invention, the resin seal increases the strength of the connection between the second substrate and the interconnection terminal.

It is therefore an object of the present invention to provide a power module which uses no solder to fix an interconnection terminal and a control circuit substrate to each other, facilitating the mounting and removal of the control circuit substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
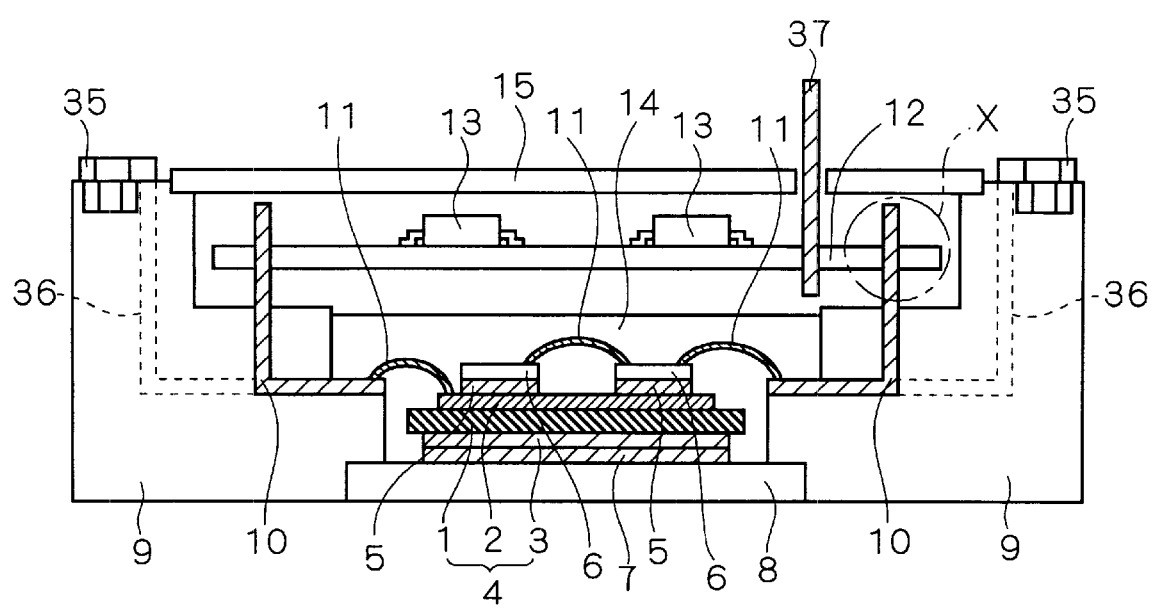
FIG. 1 is a cross-sectional view of a structure of a power module according to a first preferred embodiment of the present invention.

FIG. 1 is a cross-sectional view of a structure of a power module according to a first preferred embodiment of the present invention. As illustrated in FIG. 1, the power module according to the first preferred embodiment comprises an insulative substrate 4, a control circuit substrate 12, interconnection terminals 10, and a case 9. The insulative substrate 4 includes a ceramic plate 1, a metal plate 2 formed on a first main surface of the ceramic plate 1, and a metal plate 3 formed on a second main surface of the ceramic plate 1. A plurality of power devices 6 are mounted on the metal plate 2 with solder 5. The plurality of power devices 6 are electrically connected to each other through aluminum wires 11. The metal plate 3 is in contact with a base plate 8 made of Cu or the like and having a good heat dissipating property, with solder 7 therebetween.

A plurality of semiconductor devices 13 for controlling the power devices 6 are mounted on the control circuit substrate 12. An external connection terminal 37 electrically connected to the semiconductor devices 13 are soldered to the control circuit substrate 12. The external connection terminal 37 is a terminal for providing an external signal to the semiconductor devices 13.

Each of the interconnection terminals 10 has a first end electrically connected to the metal plate 2 or the power devices 6 through the aluminum wires 11, and a second end connected to the control circuit substrate 12. The interconnection terminals 10 are terminals for providing a control signal from the semiconductor devices 13 to the power devices 6.

The insulative substrate 4, the control circuit substrate 12 and the interconnection terminals 10 are disposed in the case 9. A lower interior space of the case 9 below the control circuit substrate 12 is filled with silicone gel 14 for ensuring insulation. A cover 15 is mounted on top of the case 9. Main electrodes 35 for drawing main current of the power devices 6 to the exterior are provided on an upper surface of the case 9 and electrically connected to the power devices 6 through terminals 36 and aluminum wires.

Figure 2:
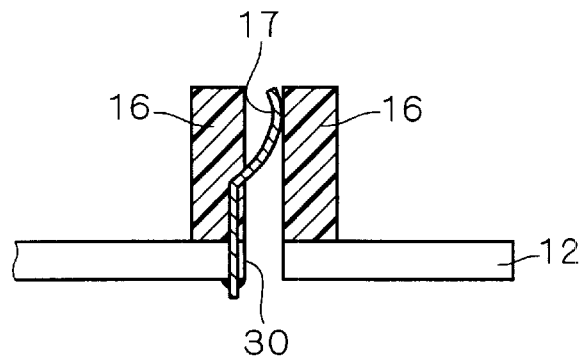
FIG. 2 is an enlarged cross-sectional view of part of a control circuit substrate which is to be connected to an interconnection terminal.

FIG. 2 is an enlarged cross-sectional view of part of the control circuit substrate 12 which is to be connected to one of the interconnection terminals 10. The control circuit substrate 12 has a through hole 30. A connector 16 made of resin is provided on a first main surface of the control circuit substrate 12 to surround the through hole 30. The connector 16 is bonded to the first main surface of the control circuit substrate 12 near the outer periphery thereof. The connector 16 includes a terminal 17 having a first end soldered to a second main surface of the control circuit substrate 12 and electrically connected to the semiconductor devices 13, and a second end projecting from an inner peripheral side surface of the connector 16. The second end of the terminal 17 has predetermined elasticity, and is displaceable in the leftward and rightward directions of FIG. 2 upon being pressed.

Figure 3:
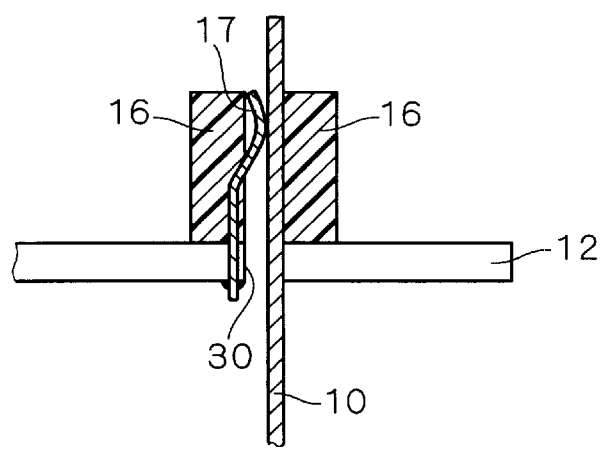
FIG. 3 is an enlarged cross-sectional view of a connection between the control circuit substrate and the interconnection terminal.

FIG. 3 is an enlarged cross-sectional view of a region X shown in FIG. 1, i.e., a connection between the control circuit substrate 12 and the interconnection terminal 10. The interconnection terminal 10 is inserted into the through hole 30 and the connector 16 from the side of the second main surface of the control circuit substrate 12. Then, the interconnection terminal 10 presses the second end of the terminal 17 to displace the second end of the terminal 17 in the leftward direction of FIG. 3. Thus, electrical and physical connections are provided between the control circuit substrate 12 and the interconnection terminal 10 in such a manner that the interconnection terminal 10 is held between the second end of the terminal 17 and the inner peripheral side surface of the connector 16.

In the power module according to the first preferred embodiment, as described above, the connector 16 disposed on the control circuit substrate 12 establishes electrical and physical connections between the interconnection terminal 10 and the control circuit substrate 12. This eliminates the need to use solder to connect the second end of the interconnection terminal 10 and the control circuit substrate 12 to each other, thereby providing the power module which facilitates the mounting and removal of the control circuit substrate 12.

Additionally, the disposition of the connector 16 near the outer periphery of the control circuit substrate 12 facilitates the mounting of the control circuit substrate 12 to the second end of the interconnection terminal 10. Further, this disposition reduces the amount of flexure of the control circuit substrate 12 when load is placed upon the connector 16 from above for mounting of the control circuit substrate 12 to the interconnection terminal 10, as compared with the disposition of the connector 16 near the center of the control circuit substrate 12. Consequently, an inexpensive material may be used to construct the control circuit substrate 12 to accomplish reduction in manufacturing costs.

Figure 4:
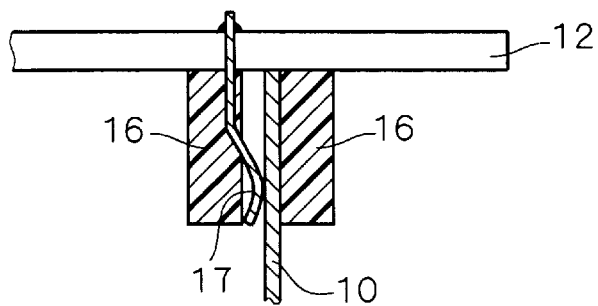
FIG. 4 is a partial cross-sectional view on an enlarged scale of a structure of the power module according to a first modification of the first preferred embodiment.

FIG. 4 is a partial cross-sectional view on an enlarged scale of a structure of the power module according to a first modification of the first preferred embodiment of the present invention. Although the connector 16 shown in FIGS. 2 and 3 is disposed on the first main surface of the control circuit substrate 12, the connector 16 may be disposed on the second main surface of the control circuit substrate 12 as shown in FIG. 4. Such a structure produces effects to be described below. With the second end of the interconnection terminal 10 connected to the connector 16, stresses acting to separate the connector 16 and the control circuit substrate 12 at their connection from each other are not exerted. Therefore, the connector 16 is prevented from being removed from the control circuit substrate 12. Further, since the control circuit substrate 12 abuts against a tip of the interconnection terminal 10, a position in which the control circuit substrate 12 is to be disposed in the case 9 may be more easily adjusted to the height of the second end of the interconnection terminal 10. On the other hand, the disposition of the connector 16 on the first main surface of the control circuit substrate 12 as shown in FIGS. 2 and 3 reduces the thickness of the power module since both of the connector 16 and the semiconductor devices 13 are formed on the first main surface of the control circuit substrate 12. Both of the connector 16 and the semiconductor devices 13 may be disposed on the second main surface of the control circuit substrate 12, which can reduce the thickness of the power module while preventing the removal of the connector 16 from the control circuit substrate 12.

Figure 5:
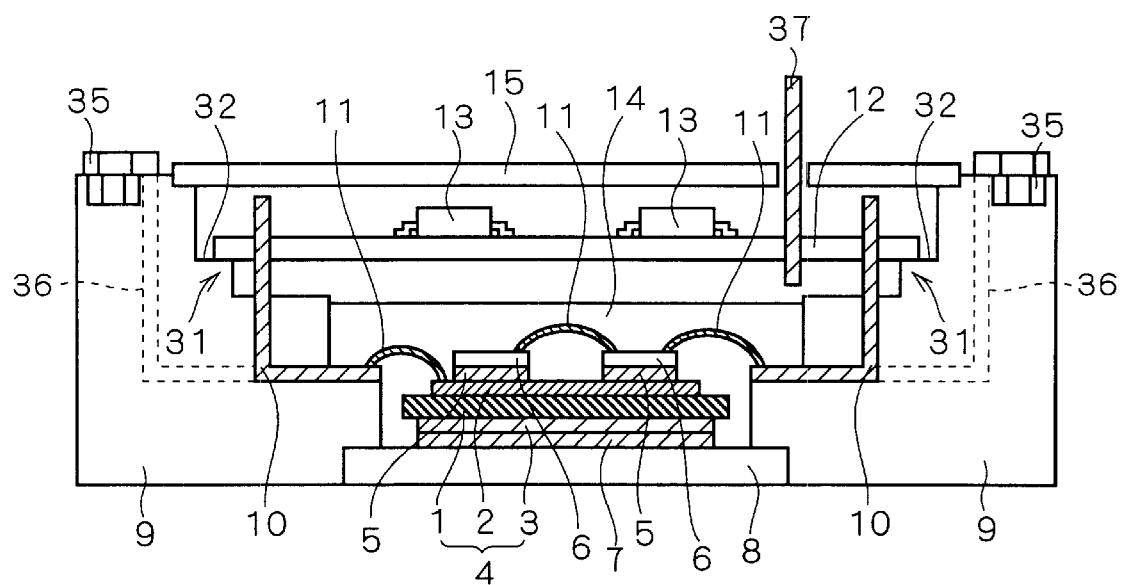
FIG. 5 is a cross-sectional view of a structure of the power module according to a second modification of the first preferred embodiment.

FIG. 5 is a cross-sectional view of a structure of the power module according to a second modification of the first preferred embodiment of the present invention. The case 9 has a positioning portion 31 for defining a receiving surface 32 for placing the control circuit substrate 12 thereon. This provides a simple structure employing no other members to increase the accuracy of a mounting position of the control circuit substrate 12. Moreover, the control circuit substrate 12 may be screw-held to the receiving surface 32. This second modification of the first preferred embodiment is applicable to the power module of a third preferred embodiment to be described later.

Second Preferred Embodiment

Figure 6:
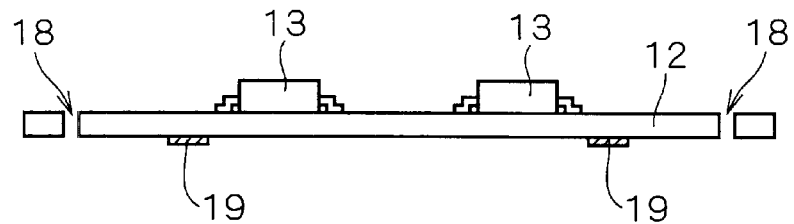
FIG. 6 is a cross-sectional view of a structure of the control circuit substrate in the power module according to a second preferred embodiment of the present invention.

FIG. 6 is a cross-sectional view of a structure of the power module according to a second preferred embodiment of the present invention. The external connection terminal 37 is not shown in FIG. 6. The plurality of semiconductor devices 13 are mounted on the first main surface of the control circuit substrate 12. A plurality of lands 19 (conductor patterns) electrically connected to the semiconductor devices 13 are provided on the second main surface of the control circuit substrate 12. The control circuit substrate 12 has a plurality of threaded holes 18 extending through the control circuit substrate 12 between the first and second main surfaces thereof and arranged in predetermined locations.

Figure 7:
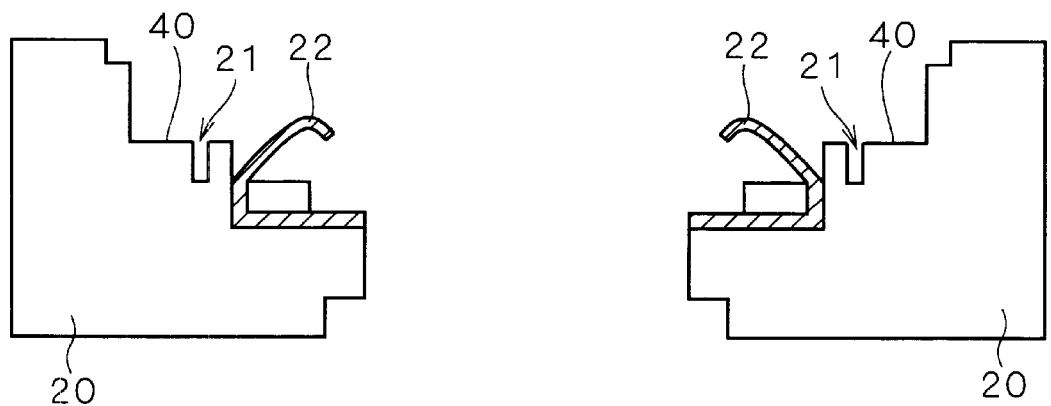
FIG. 7 is a cross-sectional view of a structure of a case in the power module according to the second preferred embodiment.

FIG. 7 is a cross-sectional view of a structure of a case 20 in the power module according to the second preferred embodiment of the present invention. The main electrodes 35 and the terminals 36 are not shown in FIG. 7. The case 20 has a receiving surface 40 for placing the control circuit substrate 12 shown in FIG. 6 thereon. The receiving surface 40 has threaded holes 21 located so as to correspond to the threaded holes 18 respectively, with the control circuit substrate 12 placed on the receiving surface 40. Interconnection terminals 22 each having a first end for electrical connection through the aluminum wires 11 (not shown) to the power devices 6 (not shown) or the metal plate 2 (not shown) are buried in the case 20, and a second end projecting from the case 20. The second end of each of the interconnection terminals 22 has predetermined elasticity, and is displaceable in the upward and downward directions of FIG. 7 upon being pressed. With the control circuit substrate 12 not placed on the receiving surface 40, the second end of each of the interconnection terminals 22 is located above the receiving surface 40.

Figure 8:
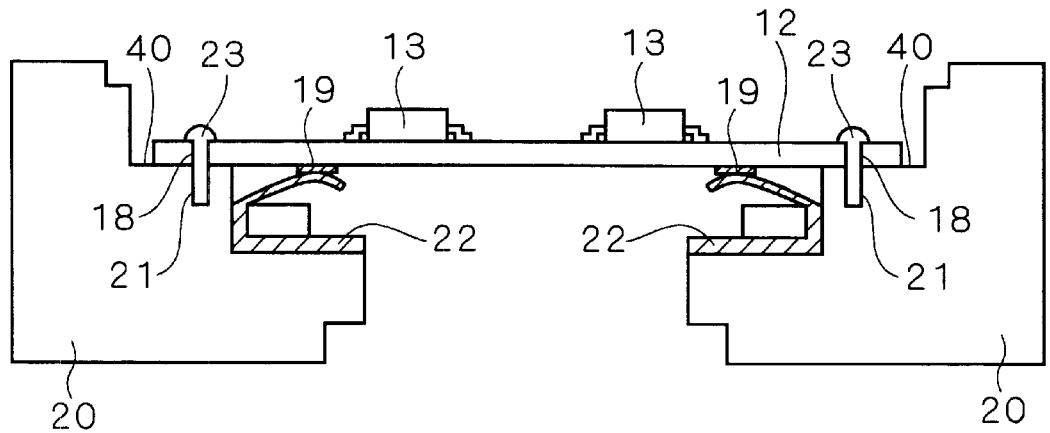
FIG. 8 is a cross-sectional view of the control circuit substrate placed and fixed on a receiving surface of the case.

FIG. 8 is a cross-sectional view of the control circuit substrate 12 placed and fixed on the receiving surface 40 of the case 20. The control circuit substrate 12 is placed on the receiving surface 40, with the threaded holes 18 and the threaded holes 21 in alignment with each other, and screws 23 are screwed into the threaded holes 18 and 21 from the side of the first main surface of the control circuit substrate 12 to join the control circuit substrate 12 and the case 20 to each other. Then, the lands 19 press the second end of the interconnection terminals 22 to displace the second end of the interconnection terminals 22 in the downward direction of FIG. 8. Thus, the resiliency of the second end of the interconnection terminals 22 which exerts in the upward direction of FIG. 8 ensured the electrical contact between the lands 19 and the second end of the interconnection terminals 22.

In the power module according to the second preferred embodiment, as above described, the case 20 and the control circuit substrate 12 are joined to each other by the screws 23. The second end of the interconnection terminals 22 and the lands 19 are fixed to each other by the resiliency of the second end of the interconnection terminals 22 displaced by the pressure applied by the lands 19. This eliminates the need to use solder to fix the second end of the interconnection terminals 22 and the control circuit substrate 12 to each other, thereby providing the power module which facilitates the mounting and removal of the control circuit substrate 12.

The power module of the second preferred embodiment which includes the thin lands 19 formed on the second main surface of the control circuit substrate 12 is reduced in thickness, as compared with the power module of the first preferred embodiment including the connector 16.

Third Preferred Embodiment

Figure 9:
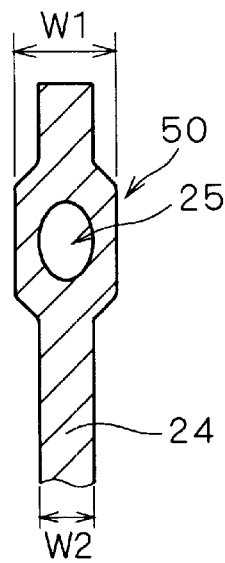
FIG. 9 is a cross-sectional view of a structure of the interconnection terminal in the power module according to a third preferred embodiment of the present invention.

FIG. 9 is a cross-sectional view of a structure of an interconnection terminal 24 in the power module according to a third preferred embodiment of the present invention. The interconnection terminal 24 has a first end connected to the power devices 6 or the like in the above-mentioned manner, and a second end only which is shown in FIG. 9. The second end of the interconnection terminal 24 having a width W2 includes a partially wider part 50 having a width W1 (W1>W2). The wider part 50 has an inner hole 25 and accordingly is hollow. The wider part 50 has predetermined elasticity in the widthwise directions of the interconnection terminal 24 (or in the leftward and rightward directions of FIG. 9), and is displaceable in the inward direction of the interconnection terminal 24 upon being pressed.

Figure 10:
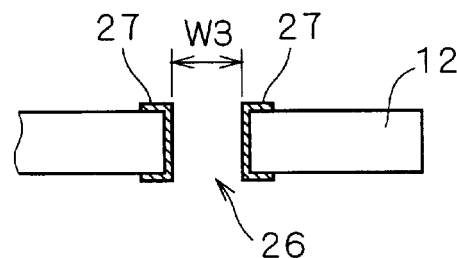
FIG. 10 is an enlarged cross-sectional view of part of the control circuit substrate which is to be fixed to the interconnection terminal in the power module according to the third preferred embodiment.

FIG. 10 is an enlarged cross-sectional view of part of the control circuit substrate 12 which is to be fixed to the interconnection terminal 24 in the power module of the third preferred embodiment of the present invention. The control circuit substrate 12 has a through hole 26 having a sidewall covered with a conductor 27 electrically connected to the semiconductor devices 13 not shown. The through hole 26 has a width W3 (W1>W3>W2) when the conductor 27 is regarded as part of the through hole 26.

Figure 11:
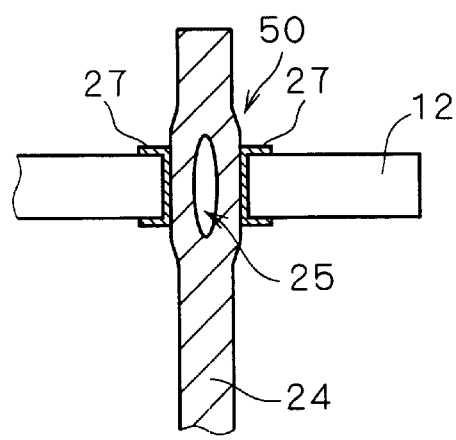
FIG. 11 is a cross-sectional view of the interconnection terminal of FIG. 9 and the control circuit substrate. of FIG. 10 which are fixed to each other.

FIG. 11 is a cross-sectional view of the interconnection terminal 24 of FIG. 9 and the control circuit substrate 12 of FIG. 10 which are fixed to each other. The interconnection terminal 24 is inserted into the through hole 26 from the side of the second main surface of the control circuit substrate 12. Since the width W1 of the wider part 50 is greater than the width W3 of the through hole 26, the conductor 27 presses the wider part 50 inwardly from the outside to deform the hole 25. Thus, the second end of the interconnection terminal 24 is fitted in the conductor 27. The outward resilience of the wider part 50 against the pressure of the conductor 27 ensures the electrical contact between the wider part 50 and the conductor 27.

In the power module according to the third preferred embodiment, as above described, the second end of the interconnection terminal 24 and the control circuit substrate 12 are fixed to each other by fitting the wider part 50 of the interconnection terminal 24 in the conductor 27 covering the sidewall of the through hole 26. This eliminates the need to use solder to fix the second end of the interconnection terminals 24 and the control circuit substrate 12 to each other, thereby providing the power module which facilitates the mounting and removal of the control circuit substrate 12.

Fourth Preferred Embodiment

Figure 12:
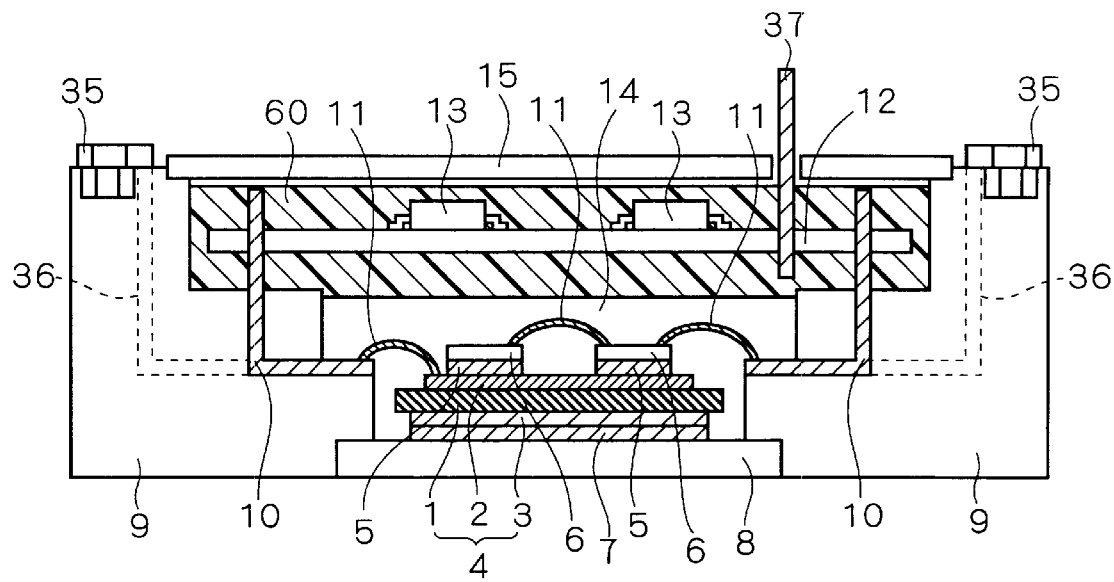
FIG. 12 is a cross-sectional view of a structure of the power module according to a fourth preferred embodiment of the present invention.

FIG. 12 is a cross-sectional view of a structure of the power module according to a fourth preferred embodiment of the present invention. The power module shown in FIG. 12 according to the fourth preferred embodiment is constructed based on the power module of the first preferred embodiment but differs therefrom in that an interior space of the case 9 above the silicone gel 14 is filled with resin 60 such as epoxy resin.

Figure 13:
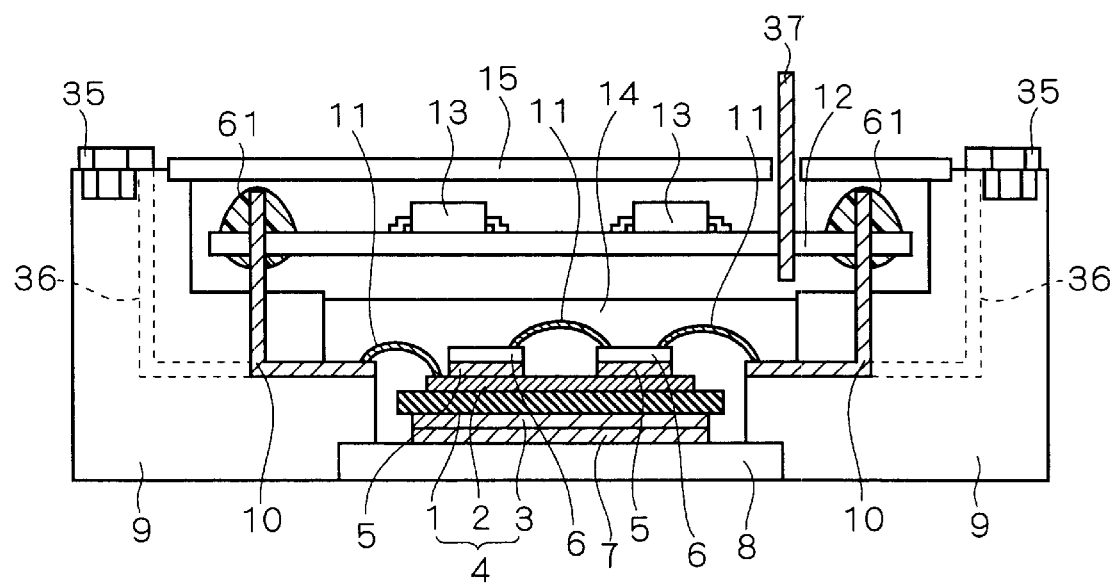
FIG. 13 is a cross-sectional view of another structure of the power module according to the fourth preferred embodiment.
Figure 14:
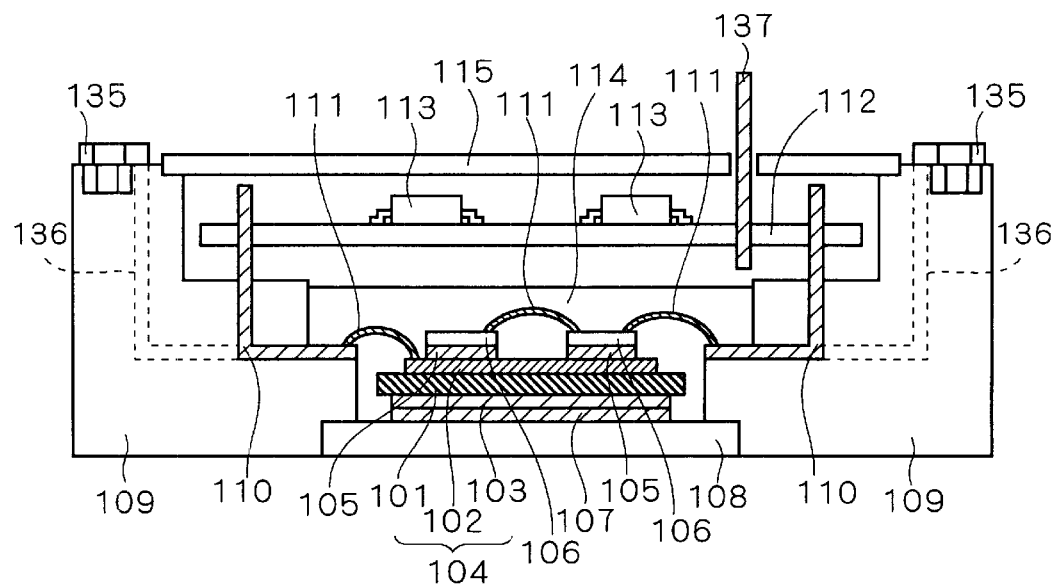
FIG. 14 is a cross-sectional view of a structure of a background art power module.
Figure 15:
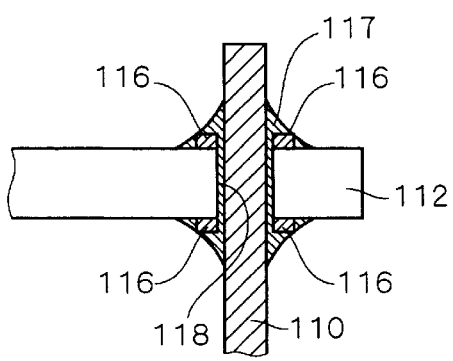
FIG. 15 is an enlarged cross-sectional view of a connection between an interconnection terminal and a control circuit substrate in the background art power module.

FIG. 13 is a cross-sectional view of another structure of the power module according to the fourth preferred embodiment of the present invention. The power module shown in FIG. 13 according to the fourth preferred embodiment is constructed based on the power module of the first preferred embodiment but differs therefrom in that connections between the interconnection terminals 10 and the control circuit substrate 12 are sealed with resin 61 by potting or the like.

Although described above are applications of the present invention according to the fourth preferred embodiment to the power module of the first preferred embodiment, the present invention according to the fourth preferred embodiment may be applied to the power modules of the second and third preferred embodiments.

Thus, in the power modules shown in FIGS. 12 and 13 according to the fourth preferred embodiment, the resins 60 and 61 seal at least the connections between the interconnection terminals 10 and the control circuit substrate 12 to increase the strength of the connections. This prevents a crack in the control circuit substrate 12 at the connections and the removal of a circuit pattern formed on the control circuit substrate 12 due to external vibrations or external impacts. Consequently, the power module has a wide range of product applications against external vibrations and the like.

While the invention has been described in detail, the foregoing description is in all aspects illustrative and not restrictive. It is understood that numerous other modifications and variations can be devised without departing from the scope of the invention.

What is claimed is:

1. A power module comprising:
   a first substrate including a power device;
   a second substrate opposed to said first substrate and including a semiconductor device for controlling said power device;
   an interconnection terminal having a first end electrically connected to said first substrate, and a second end electrically connected to said second substrate; and
   a case in which said first substrate, said second substrate and said interconnection terminal are disposed,
   wherein said second substrate further includes a connector electrically connected to said semiconductor device, and
   wherein said second end of said interconnection terminal is removably connected to said connector.

2. The power module according to claim 1,
   wherein said connector is disposed near an outer periphery of said second substrate.

3. The power module according to claim 1,
   wherein said connector is formed on a main surface of said second substrate which is on the same side as is said semiconductor device.

4. The power module according to claim 1,
   wherein said connector is formed on a main surface of said second substrate which is opposed to said first substrate.

5. The power module according to claim 1,
   wherein said case includes a positioning structure for defining a mounting position of said second substrate in said case.

6. The power module according to claim 1,
   wherein at least a connection between said second substrate and said interconnection terminal is sealed with resin.

7. A power module comprising:
   a first substrate including a power device;
   a second substrate opposed to said first substrate and including a semiconductor device for controlling said power device;
   an interconnection terminal having a first end electrically connected to said first substrate, and a second end electrically connected to said second substrate; and
   a case in which said first substrate, said second substrate and said interconnection terminal are disposed,
   wherein said second end of said interconnection terminal has elasticity, and
   wherein said second substrate further includes a conductor pattern formed on a main surface of said second substrate which is opposed to said first substrate, said conductor pattern being electrically connected to said semiconductor device and contacting said second end of said interconnection terminal,
   said power module further comprising
      fastening means for removably fixing said case and said second substrate to each other, with said second end of said interconnection terminal displaced upon being pressed by said conductor pattern.

8. The power module according to claim 7,
   wherein said case includes a receiving surface for placing said second substrate thereon, and
   wherein said fastening means includes:
      a first threaded hole formed in said receiving surface;
      a second threaded hole formed in said second substrate in a position corresponding to said first threaded hole; and
      a screw configured to be screwed into said first and second threaded holes.

9. The power module according to claim 7,
   wherein at least a connection between said second substrate and said interconnection terminal is sealed with resin.

10. A power module comprising:
    a first substrate including a power device;
    a second substrate opposed to said first substrate and including a semiconductor device for controlling said power device;
    an interconnection terminal having a first end electrically connected to said first substrate, and a second end electrically connected to said second substrate; and
    a case in which said first substrate, said second substrate and said interconnection terminal are disposed,
    wherein said second substrate further includes a through hole electrically connected to said semiconductor device, and
    wherein said second end of said interconnection terminal has elasticity in a widthwise direction thereof, and is removably fitted in said through hole.

11. The power module according to claim 10,
    wherein said case includes a positioning structure for defining a mounting position of said second substrate in said case.

12. The power module according to claim 10,
    wherein at least a connection between said second substrate and said interconnection terminal is sealed with resin.

13. The power module according to claim 1,
    wherein said connector includes:
       a connector base material formed on said second substrate and including first and second side surfaces opposed to each other; and
       a conductive terminal projecting from said first side surface, said conductive terminal being electrically connected to said semiconductor device and having elasticity,
    wherein said second end of said interconnection terminal is connected to said connector by being inserted between said first side surface and said second side surface to be sandwiched between said terminal and said second side surface.

* * * * *